(12) United States Patent
Lam et al.

(10) Patent No.: US 8,421,194 B2
(45) Date of Patent: Apr. 16, 2013

(54) SUB-LITHOGRAPHIC PRINTING METHOD

(75) Inventors: Chung H. Lam, Peekskill, NY (US); Hemantha K. Wickramasinghe, Irvine, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/006,403

(22) Filed: Jan. 13, 2011

(65) Prior Publication Data
US 2011/0108960 A1    May 12, 2011

Related U.S. Application Data

(62) Division of application No. 12/018,316, filed on Jan. 23, 2008, now Pat. No. 7,879,728.

(51) Int. Cl.
*H01L 29/06* (2006.01)

(52) U.S. Cl.
USPC .................. 257/622; 257/506; 257/E29.022

(58) Field of Classification Search .................. 257/506, 257/510, 513, 622, E21.002, E21.214, E29.022; 438/702
See application file for complete search history.

(56) References Cited

U.S. PATENT DOCUMENTS

| | | | | |
|---|---|---|---|---|
| 6,063,688 A * | 5/2000 | Doyle et al. | | 438/424 |
| 6,638,441 B2 * | 10/2003 | Chang et al. | | 216/46 |
| 2008/0090418 A1 * | 4/2008 | Jeon et al. | | 438/689 |

* cited by examiner

*Primary Examiner* — Chuong A Luu
*Assistant Examiner* — Nga Doan
(74) *Attorney, Agent, or Firm* — Ido Tuchman; Vazken Alexanian

(57) ABSTRACT

A trench structure and an integrated circuit comprising sub-lithographic trench structures in a substrate. In one embodiment the trench structure is created by forming sets of trenches with a lithographic mask and filling the sets of trenches with sets of step spacer blocks comprising two alternating spacer materials which are separately removable from each other. In one embodiment, the trench structures formed are one-nth the thickness of the lithographic mask's feature size. The size of the trench structures being dependent on the thickness and number of spacer material layers used to form the set of step spacer blocks. The number of spacer material layers being n/2 and the thickness of each spacer material layer being one-nth of the lithographic mask's feature size.

4 Claims, 11 Drawing Sheets

SUB-LITHOGRAPHIC PRINTING METHOD

CROSS-REFERENCE TO RELATED APPLICATIONS

This application is a divisional application claiming benefit under 35 U.S.C. §120 to the filing date of U.S. patent application Ser. No. 12/018,316 filed Jan. 23, 2008, the entire text of which is specifically incorporated by reference herein.

BACKGROUND OF THE INVENTION

1. Field of the Invention

The present invention relates to formation of trench structures over a substrate, and more particularly to a method of forming sub-lithographic trench structures.

2. Description of Background

Typical semiconductor computer memories are fabricated on semiconductor substrates consisting of arrays of large number of physical memory cells. The memory cells in these memory arrays are generally connected by conductive channels carrying electrical current between individual memory cells, the memory array, and a memory controller. These conductive channels are often referred to as "bit-lines" and "word-lines". As memory cells and memory arrays have decreased in size, the conductive channels connecting forming the connections between the cells and array must also decrease in size.

Conductive channels formed on the substrate may be formed with a variety of methods. One common method is to deposit conductive material directly into a trench structure on the substrate. Often, methods used for trench structure formation include at least one step involving photolithography. The photolithographic methods employed for the formation of conductive channels and other structures formed on a substrate are typically limited by the wavelength of deep ultraviolet (DUV) a photolithographic tool uses. Thus, it is desirable to devise a method to form trench structures not limited by the specifications of the photolithographic tool being used.

SUMMARY OF THE INVENTION

An exemplary embodiment of the present invention is a method for forming trench structures disposed over a substrate. The substrate can be, but is not limited to, bare silicon substrate or silicon substrate with a layer of insulating material deposited on the top surface of the silicon substrate.

Another exemplary aspect of the present invention is an integrated circuit comprising a trench structure disposed over a substrate. The integrated circuit is formed at least in part by the deposition of a sacrificial layer of a sacrificial material over the substrate. A first set of trenches is formed in the sacrificial layer. The first set of trenches is completely filled with a first set of step spacer blocks using two alternating spacer materials that are separately removable A second set of trenches is formed by selectively removing the remaining sacrificial material after filling the first set of trenches. The second set of trenches are completely filled with a second set of step spacer blocks using the same two alternating spacer materials as the first set of spacer blocks, with the two alternating spacer materials continuing in sequence with the alternating spacer materials in the first set of step spacer blocks. One of the two alternating spacer materials is selectively removed, thereby forming a hard mask above the substrate. Finally, the hard mask is utilized to etch the trench structure in the substrate of the integrated circuit.

A further exemplary aspect of the present invention is a trench structure disposed over a substrate. The trench structure is formed at least in part by the deposition of a sacrificial layer of a sacrificial material over the substrate. A first set of trenches is formed in the sacrificial layer. The first set of trenches is completely filled with a first set of step spacer blocks using two alternating spacer materials that are separately removable A second set of trenches is formed by selectively removing the remaining sacrificial material after filling the first set of trenches. The second set of trenches are completely filled with a second set of step spacer blocks using the same two alternating spacer materials as the first set of spacer blocks, with the two alternating spacer materials continuing in sequence with the alternating spacer materials in the first set of step spacer blocks. One of the two alternating spacer materials is selectively removed, thereby forming a hard mask above the substrate. Finally, the hard mask is utilized to etch the trench structure in the substrate.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
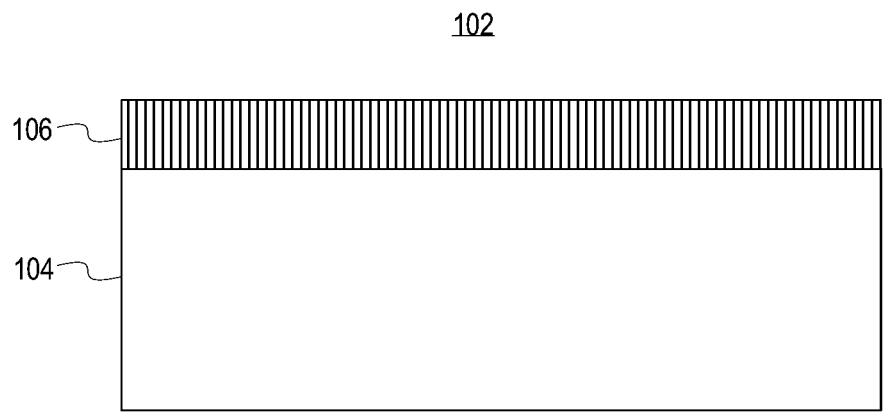
FIG. 1 illustrates a starting wafer.

The present invention will be described with reference to FIGS. 1-20. When referring to the figures, like elements shown throughout are indicated with like reference numerals. The embodiments of the present invention are generally directed to, but are not limited to, forming sub-lithographic trenches in semiconductor substrates. These sub-lithographic trenches may be used, for example, in the formation of bit-lines and word-lines in a memory array or integrated circuit in semi-conductor computer memory.

FIG. 1 illustrates an exemplary embodiment of a starting wafer 102. The exemplary embodiment of the starting wafer 102 is comprised of a silicon substrate 104 and an insulating layer 106. The insulating layer 106 may be comprised of only one material or the insulating layer 106 may itself be comprised of several layers of insulating materials. Those skilled in the art will recognize that a variety of insulating materials may be used. In one embodiment of the invention the insulating layer 106 is comprised of silicon dioxide.

In an alternate embodiment, the starting wafer 102 is only comprised of the silicon substrate 104. Additionally, those skilled in the art will recognize that a variety of front end of line (FEOL) wafers may be used as the starting wafer 102.

Figure 2:
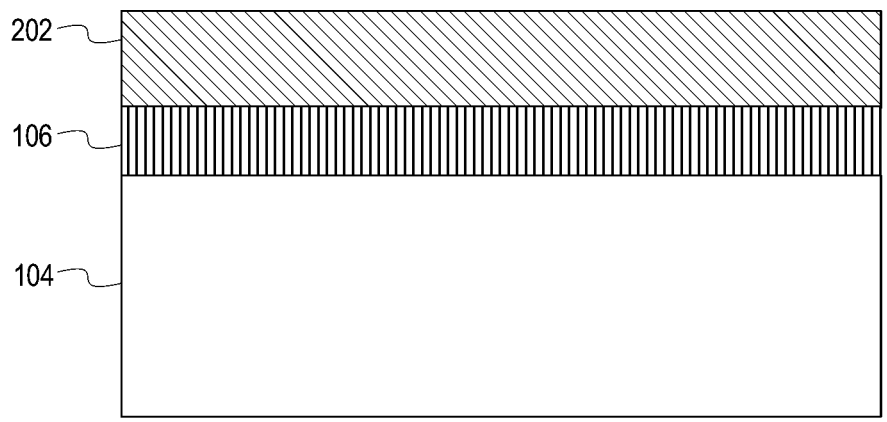
FIG. 2 illustrates a deposition of sacrificial material.

Turning to FIG. 2, a sacrificial layer 202 is deposited on top of the insulating layer 106. In one embodiment of the invention the sacrificial layer 202 is comprised of silicon nitride. The only limiting factor to the material used for the sacrificial layer 202 is that it must be separately removable from the insulating layer 106 and/or the silicon substrate 104.

Those skilled in the art will recognize that a variety of processes may be used to deposit the sacrificial layer 106. An example of such a process is chemical vapor deposition (CVD).

Figure 3:
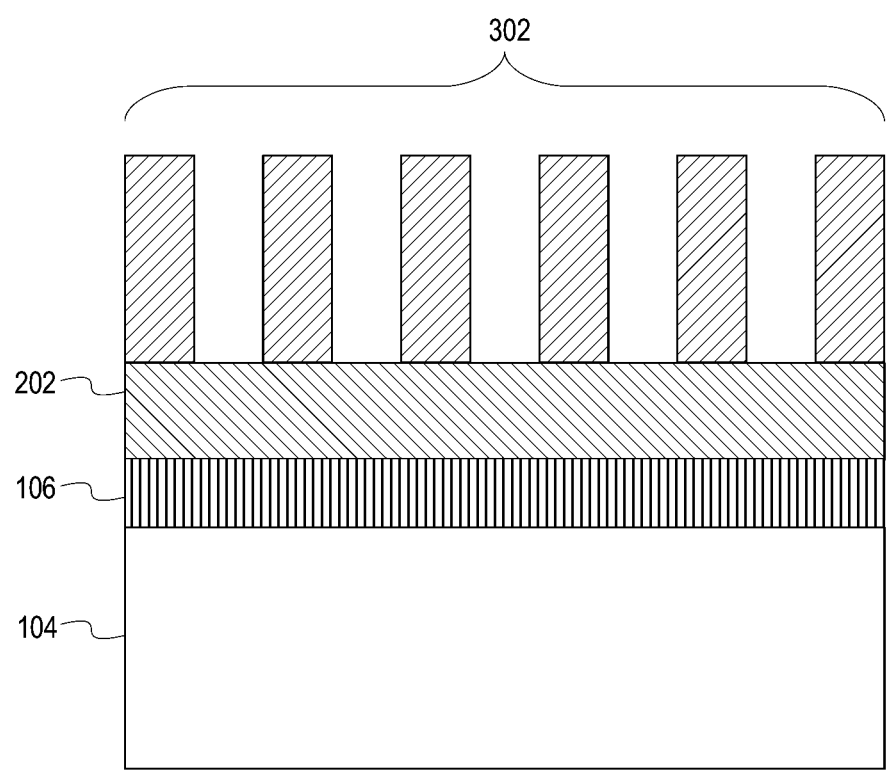
FIG. 3 illustrates the formation of a lithographic mask.

FIG. 3 shows a formation of a lithographic mask 302 deposited above the sacrificial layer 202. The lithographic mask 302 may be of any pattern as long as it is able to form trenches in the sacrificial layer 202 upon the etching of the sacrificial layer 202. The employment of lithographic masks to form lithographic features is well known in the art and is disclosed, for example, in U.S. Pat. No. 6,358,813 issued to Holmes et al. U.S. Pat. No. 6,358,813 is incorporated herein by reference.

Figure 4:
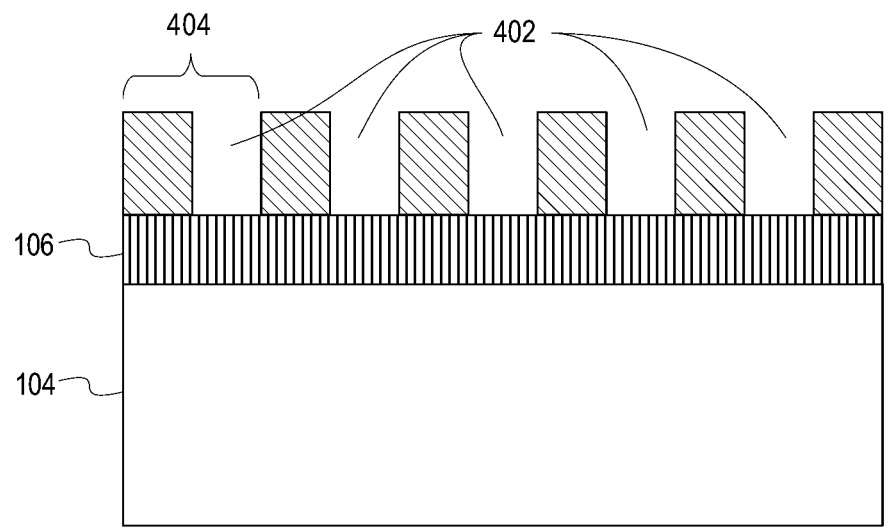
FIG. 4 illustrates the formation of a first set of trenches.

FIG. 4 illustrates a formation of a first set of trenches 402 and the removal of the lithographic mask. The first set of trenches 402 are created by etching the sacrificial layer not covered by the lithographic mask. The etching of the sacrificial layer should selectively remove the exposed areas of the sacrificial layer and stop on the silicon substrate 104 or the insulating layer 106. Those skilled in the art will recognize that a variety of dry etches may be utilized in this process. An example of a dry etch would be reactive ion etch (RIE). Those skilled in the art will also recognize that a wet resist strip or a dry plasma ash will remove the lithographic mask.

FIG. 4 also illustrates a lithographic mask's feature size 404. The lithographic mask's feature size is typically limited to the wavelength of deep ultraviolet (DUV) light a photolithographic tool uses. The lithographic mask's feature size will be relevant later in the process when step spacers and spacer plugs are deposed into the first set of trenches 402.

Figure 5:
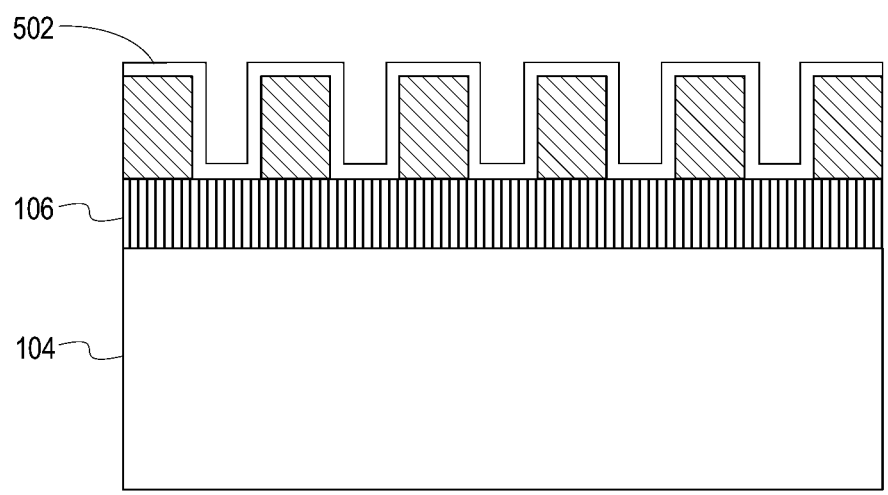
FIGS. 5-10 illustrate the formation of a first set of step spacer blocks.

Turning to FIG. 5, a layer of first spacer material 502 is deposited over the structures formed by the etching of the sacrificial layer, over the bottom of the first set of trenches, and sidewalls of the first set of trenches. A variety of spacer materials can be used for the layer of first spacer material 502. In an exemplary embodiment of the present invention the layer of first spacer material 502 is comprised of intrinsic polycrystalline silicon. In alternate embodiments of the invention the layer of first spacer material 502 may be comprised of P-doped polycrystalline silicon or N-doped polycrystalline silicon. The only limiting factor to selection of the first spacer material is that it must be separately removable from the sacrificial layer, the insulating layer 106 (if there is an insulating layer 106), and the silicon substrate 104. Again, those skilled in the art will recognize that a variety of CVD processes may be employed to deposit the layer of first spacer material 502.

In an exemplary embodiment of the present invention where a final trench structure's size is one-quarter of the lithographic mask's feature size, the thickness of the layer of first spacer material 502 is one-eighth of the lithographic mask's feature size. In an alternate embodiment of the invention where the final trench structure's size is one-nth of the lithographic mask's feature size, the thickness of the layer of first spacer material 502 is one-half of one-nth of the lithographic mask's feature size. In this alternate embodiment of the invention, n is an even integer equal or greater than 2. The two aforementioned embodiments mentioned produce a pattern of uniformly spaced trenches. One skilled in the art will recognize that the thickness of the layer of first spacer material 502 can be of an arbitrary thickness depending on the pattern desired.

Figure 6:
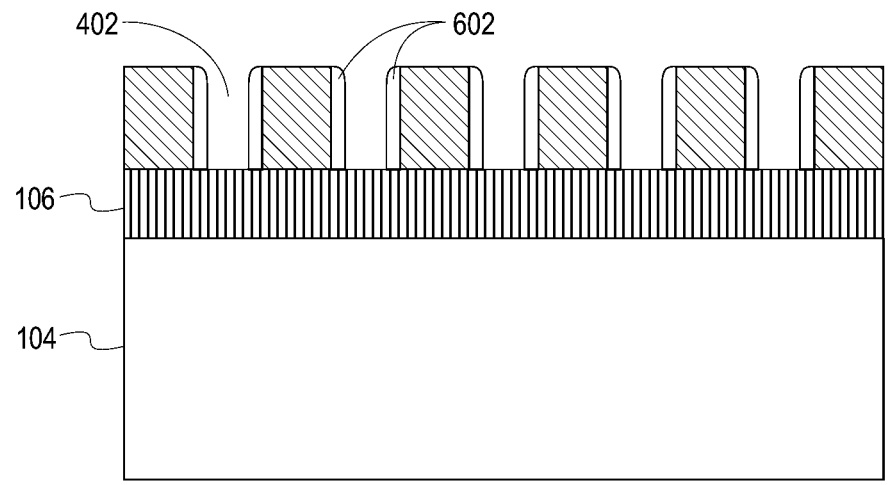

FIG. 6 illustrates a formation of first pairs of step spacers 602 in the first set of trenches 402. The first pairs of step spacers 602 are formed along the sidewalls of the first set of trenches 402. The first pairs of step spacers 602 are created by etching the layer of first spacer material with a directional dry etch removing the first spacer material over the sacrificial layer and removing the first spacer material over the bottom of the first set of trenches 402. Those skilled in the art will recognize that a variety of directional dry etches may be used to form the first pairs of step spacers 602. An example of such a directional dry etch is a spacer RIE. The gases used for the RIE will be dependent on the type of first spacer material used.

Figure 7:
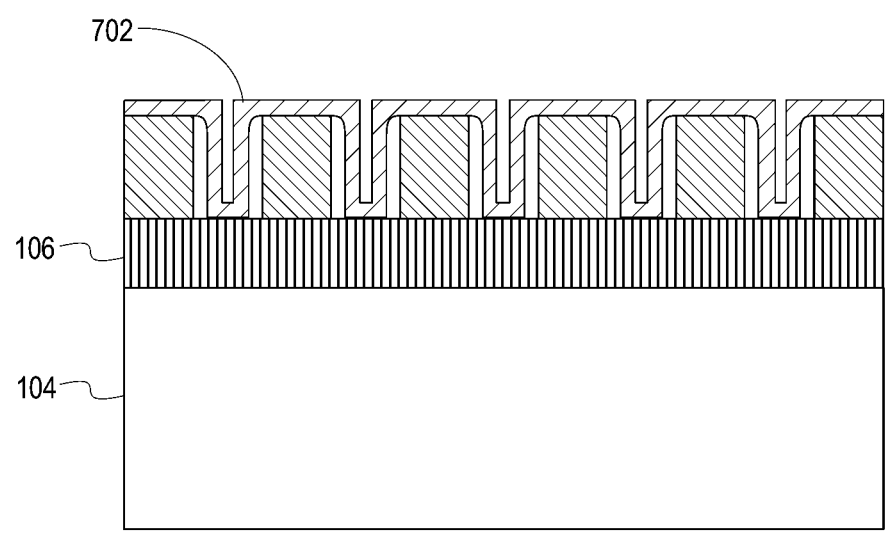

Turning to FIG. 7, a layer of second spacer material 702 is deposited over the structures formed by the etching of the sacrificial layer, along the sidewalls of the first pairs of step spacers, and over the bottom of the first set of trenches. Again, a variety of spacer materials may be used for the layer of second spacer material 702. In an exemplary embodiment of the present invention the layer of second spacer material 702 is comprised of P-doped polycrystalline silicon. In alternate embodiments of the invention the layer of second spacer material 702 may be comprised of intrinsic polycrystalline silicon or N-doped polycrystalline silicon. The only limiting factor to selection of the second spacer material is that it must be separately removable from the sacrificial layer, the insulating layer 106, if there is an insulating layer 106, the silicon substrate 104, and the first spacer material. Again, those skilled in the art will recognize that a variety of CVD processes may be employed to deposit the layer of second spacer material 502.

In an exemplary embodiment of the present invention where the final trench structure's size is one-quarter of the lithographic mask's feature size, the thickness of the layer of second spacer material 702 is one-quarter of the lithographic mask's feature size. In an alternate embodiment where the final trench structure's size is one-nth of the lithographic mask's feature size, the thickness of the layer of second spacer material 702 is one-nth of the lithographic mask's feature size. In this alternate embodiment of the invention, n is an even integer equal or greater than 2. Again, one skilled in the art will recognize that the thickness of the layer of second spacer material 502 can be of an arbitrary thickness depending on the pattern desired.

Figure 8:
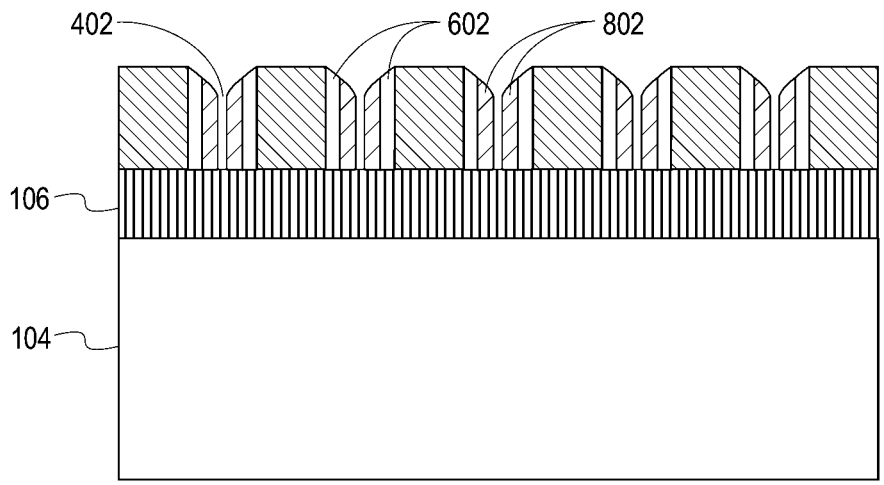

FIG. 8 shows a formation of second pairs of step spacers 802 in the first set of trenches 402. The second pairs of step spacers 802 are formed along the sidewalls of the first pairs of step spacers. The second pairs of step spacers 802 are created by etching the layer of second spacer material with a directional dry etch removing the second spacer material over the sacrificial layer and removing the second spacer material over the bottom of the first set of trenches 402. Those skilled in the art will recognize that a variety of directional dry etches may be used to form the second pairs of step spacers 802. An example of such a directional dry etch is a spacer RIE. The gases used for the RIE will be dependent on the type of second spacer material used.

In an alternate embodiment of the invention where the final trench structure's size is one-nth of the lithographic mask's feature size and k is a particular pair of step spacers, the processes shown in FIGS. 5-8 are performed n/2 times. The kth pair of step spacers are formed along the inside walls of the (k−1)th pair of step spacers if k is greater than 1 and equal or less than n/2. The kth pair of step spacers is formed along the inside walls of the first set of trenches and the inside walls of the second set of trenches if k is equal to 1. The kth pair of step spacers is formed using the first spacer material if k is odd, the kth pair of step spacers is formed using the second spacer material if k is even, n being a positive even integer equal or greater than 2.

Figure 9:
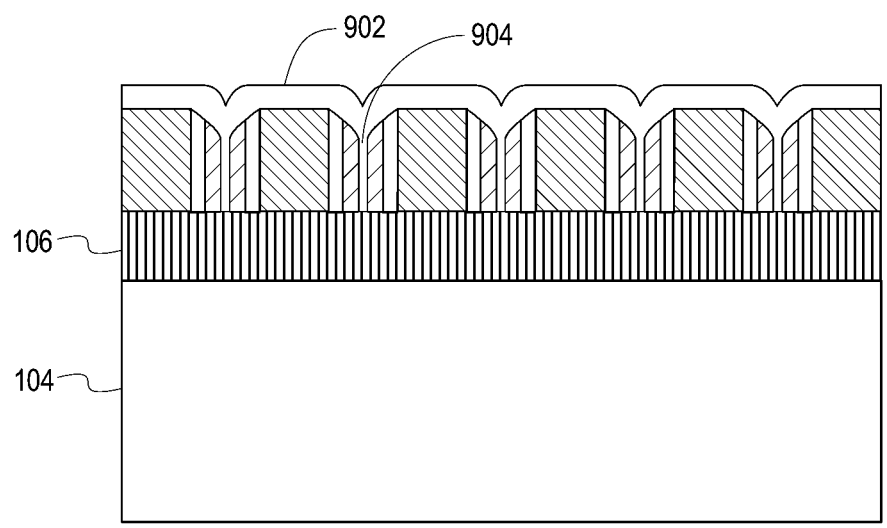

Turning to FIG. 9, a plug layer of first spacer material 902 is deposited above the remaining structures of the sacrificial layer and completely filling the first set of trenches between the sidewalls of the second pairs of step spacers. The plug layer of first spacer material 902 forms spacer plugs 904 in the first set of trenches. As stated, the plug layer of first spacer material 902 is comprised of the first spacer material.

In an exemplary embodiment of the present invention where the final trench structure's size is one-quarter of the lithographic mask's feature size, the thickness of the plug layer of first spacer material 902 is at least one-quarter of the lithographic mask's feature size. In an alternate embodiment where the final trench structure's size is one-nth of the lithographic mask's feature size, the thickness of the plug layer of first spacer material 902 is at least one-nth of the lithographic mask's feature size. Again, in this alternate embodiment of the invention, n is an even integer equal or greater than 2. One skilled in the art will recognize that the thickness of the plug layer of first spacer material 902 can be of an arbitrary thickness depending on the pattern desired.

Figure 10:
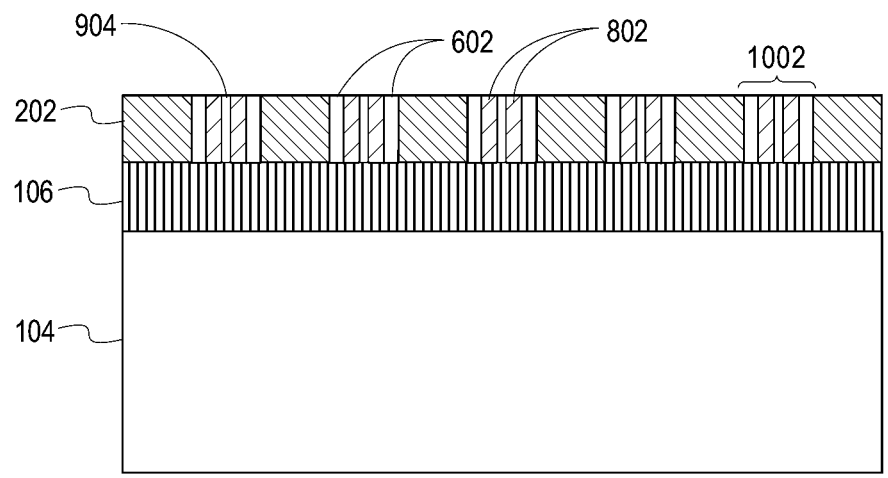

FIG. 10 illustrates a chemical mechanical polish (CMP) of the remaining sacrificial material 202, the first pairs of step spacers 602, the second pairs of step spacers 802, and the spacer plugs 904. The first pairs of step spacers 602, the second pairs of step spacer 802, and the spacer plugs 904 in the first set of trenches form a first set of step spacer blocks 1002 filling the first set of trenches. The CMP should polish the remaining sacrificial layer 202 and first set of step spacer blocks 1002 such that the surface of the remaining sacrificial layer 202 and the surface of the first set of step spacer blocks 1002 are substantially parallel to the top surface of the silicon substrate 104.

Figure 11:
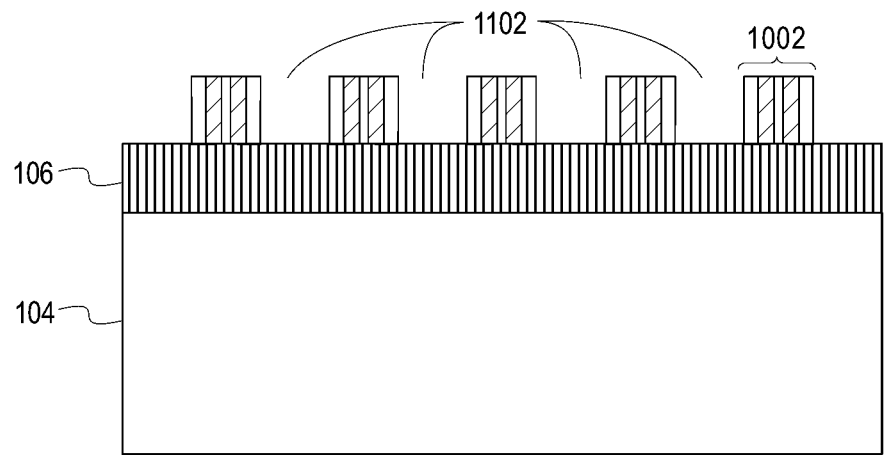
FIG. 11 illustrates the formation of a second set of trenches.

FIG. 11 shows a formation of a second set of trenches 1102. The second set of trenches 1102 are formed by removing the remaining sacrificial material such that the sidewalls of the first set of step spacer blocks 1002 serve as the sidewalls of the second set of trenches 1102. In one embodiment of the invention where the sacrificial material is silicon nitride, the remaining sacrificial material is removed by a hot phosphoric acid wet etch. As described above, a variety of materials can be used for the sacrificial material. Therefore the specific etch used must be able to separately remove the sacrificial material from the first spacer material, the second spacer material, the insulating layer 106, and/or the silicon substrate 104.

Figure 12:
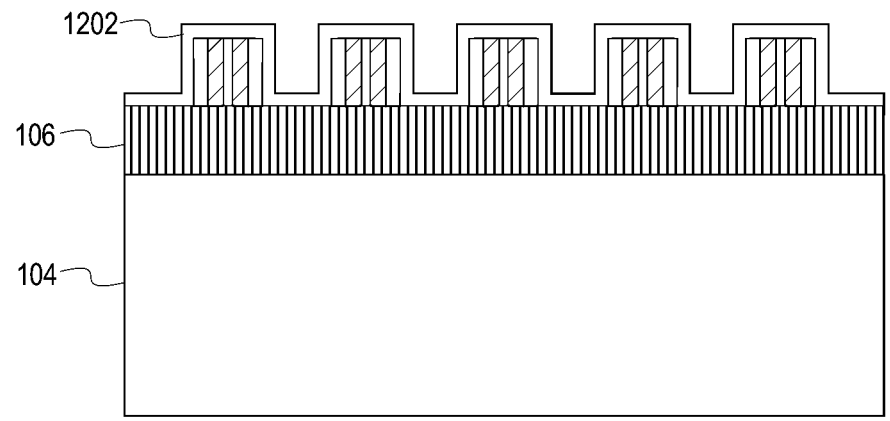
FIGS. 12-17 illustrate the formation of a second set of step spacer blocks.

Turning to FIG. 12, a second layer of first spacer material 1202 is deposited along the top surface of the first set of step spacer blocks, along the sidewalls of the first set of step spacer blocks, and along the bottom of the second set of trenches. The second layer of first spacer material 1202, as stated, is comprised of the same material used for the layer of first spacer material. As stated above, a variety of materials can be used and a variety of CVD processes may be employed to deposit the material onto the structures.

In an exemplary embodiment of the present invention where the final trench structure's size is one-quarter of the lithographic mask's feature size, the thickness of the second layer of first spacer material 1202 is one-eighth of the lithographic mask's feature size. In an alternate embodiment of the invention where the final trench structure's size is one-nth of the lithographic mask's feature size, the thickness of the second layer of first spacer material 1202 is one-half of one-nth of the lithographic mask's feature size. In this alternate embodiment of the invention, n is an even integer equal or greater than 2. One skilled in the art will recognize that the thickness of the second layer of first spacer material 1202 can be of an arbitrary thickness depending on the pattern desired.

Figure 13:
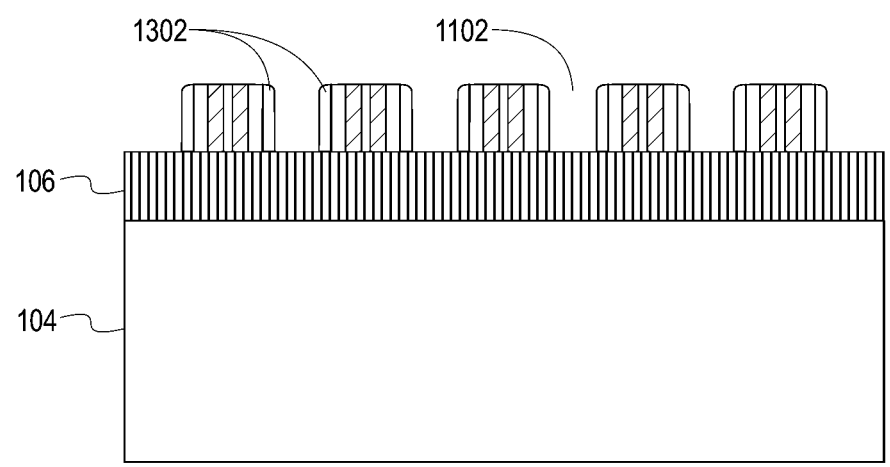

FIG. 13 shows a formation of first pairs of step spacers 1302 in the second set of trenches 1102. The first pairs of step spacers 1302 are formed along the sidewalls of the second set of trenches 1102. The first pairs of step spacers 1302 are created by etching the layer of first spacer material with a directional dry etch removing the first spacer material over the sacrificial layer and removing the first spacer material over the bottom of the second set of trenches 1102. As described above, those skilled in the art will recognize that a variety of directional dry etches may be used to form the first pairs of step spacers 1302. In one embodiment of the invention a spacer RIE is employed. The gases used for the RIE being dependent on the type of first spacer material used.

Figure 14:
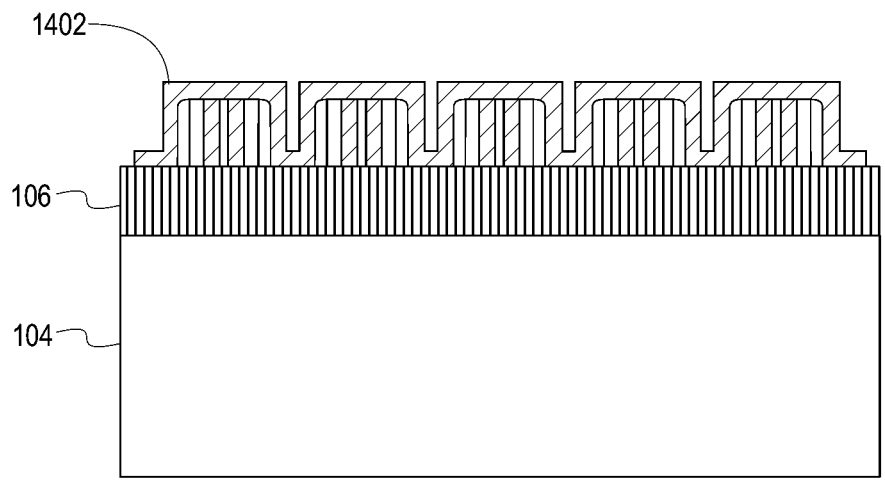

Turning to FIG. 14, a second layer of second spacer material 1402 is deposited over the first set of step spacer blocks, along the sidewalls of the first pairs of step spacers in the second set of trenches, and over the bottom of the second set of trenches. The second layer of second spacer material 1402, as stated, is comprised of the same material used for the layer of second spacer material. As stated above, a variety of materials can be used and a variety of CVD processes may be employed to deposit the material onto the structures.

In an exemplary embodiment of the present invention where the final trench structure's size is one-quarter of the lithographic mask's feature size, the thickness of the second layer of second spacer material 1402 is one-quarter of the lithographic mask's feature size. In an alternate embodiment where the final trench structure's size is one-nth of the lithographic mask's feature size, the thickness of the second layer of second spacer material 1402 is one-nth of the lithographic mask's feature size. Again, in this alternate embodiment of the invention, n is an even integer equal or greater than 2. One skilled in the art will recognize that the thickness of the second layer of first spacer material 1402 can be of an arbitrary thickness depending on the pattern desired.

Figure 15:
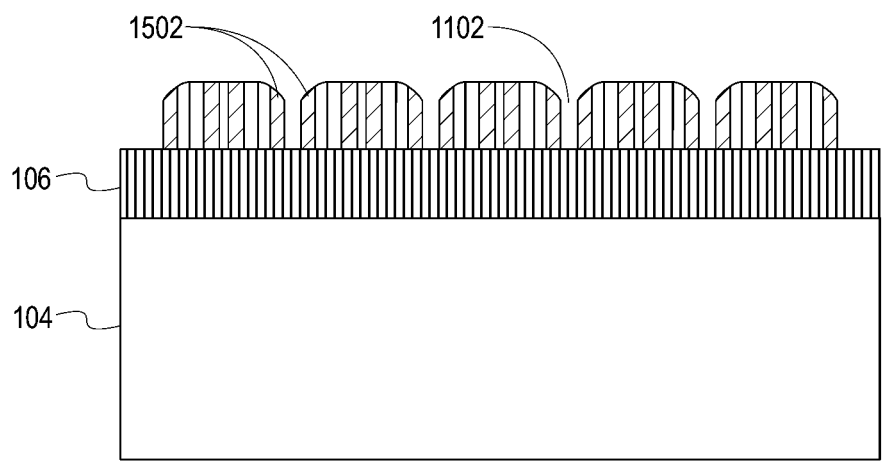

FIG. 15 shows a formation of second pairs of step spacers 1502 in the second set of trenches 1102. The second pairs of step spacers 1502 are formed along the sidewalls of the first pairs of step spacers. The second pairs of step spacers 1502 are created by etching the second layer of second spacer material with a directional dry etch removing the second spacer material over the first set of step spacer blocks and removing the second spacer material over the bottom of the second set of trenches 1102. As described above, those skilled in the art will recognize that a variety of directional dry etches may be used to form the second pairs of step spacers 1502. In one embodiment of the invention a spacer RIE is employed. The gases used for the RIE being dependent on the type of second spacer material used.

In an alternate embodiment of the invention where the final trench structure's size is one-nth of the lithographic mask's feature size and k is a particular pair of step spacers, the processes shown in FIGS. 12-15 are performed n/2 times. The kth pair of step spacers are formed along the inside walls of the (k−1)th pair of step spacers if k is greater than 1 and equal or less than n/2. The kth pair of step spacers is formed along the inside walls of the first set of trenches and the inside walls of the second set of trenches if k is equal to 1. The kth pair of step spacers is formed using the first spacer material if k is odd, the kth pair of step spacers is formed using the second spacer material if k is even, n being a positive even integer equal or greater than 2.

Figure 16:
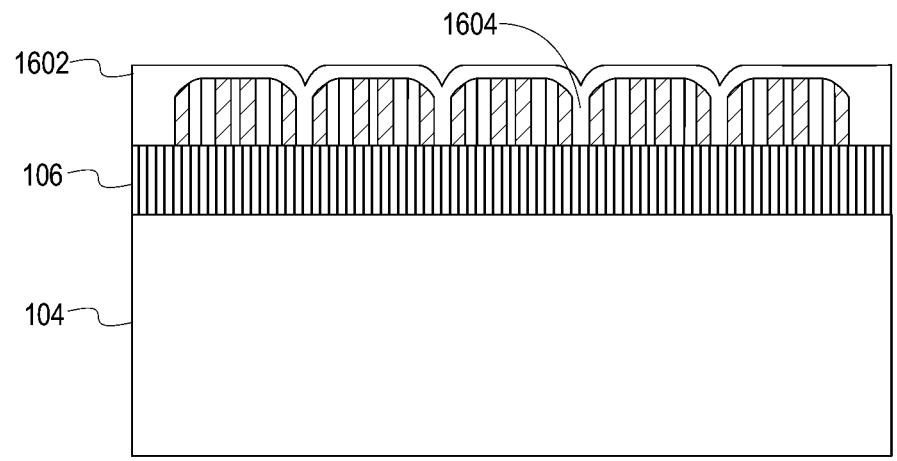

Turning to FIG. 16, a plug layer of first spacer material 1602 is deposited above the first set of step spacer blocks and completely filling the second set of trenches between the sidewalls of the second pairs of step spacers. The plug layer of first spacer material 1602 forms spacer plugs 1604 in the second set of trenches. As stated, the plug layer of first spacer material 1602 is the first spacer material.

In an exemplary embodiment of the present invention where the final trench structure's size is one-quarter of the lithographic mask's feature size, the thickness of the plug layer of first spacer material 1602 is at least one-quarter of the lithographic mask's feature size. In an alternate embodiment where the final trench structure's size is one-nth of the lithographic mask's feature size, the thickness of the plug layer of first spacer material 1602 is at least one-nth of the lithographic mask's feature size. Again, in this alternate embodiment of the invention, n is an even integer equal or greater than 2. One skilled in the art will recognize that the thickness of the plug layer of first spacer material 1602 can be of an arbitrary thickness depending on the pattern desired.

Figure 17:
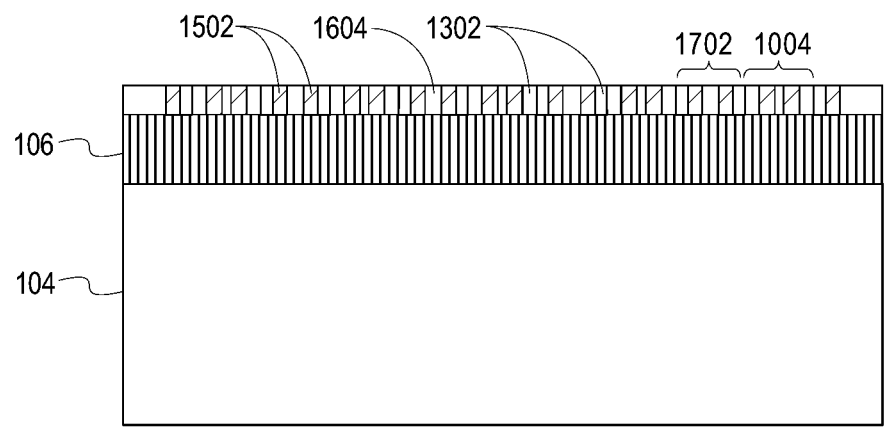

FIG. 17 illustrates a second CMP of the first set of step spacer blocks 1004, the first pairs of step spacers 1302, the second pairs of step spacers 1502, and the spacer plugs 1604. The first pairs of step spacers 1302, the second pairs of step spacers 1502, and the spacer plugs 1604 in the second set of trenches form a second set of step spacer blocks 1702 filling the second set of trenches. The CMP should polish the first set of step spacer blocks 1002 and second set of step spacer blocks 1702 such that the surface of the first set of step spacer blocks 1002 and the surface of the second set of step spacer blocks 1702 are parallel to the top surface of the silicon substrate 104.

Figure 18:
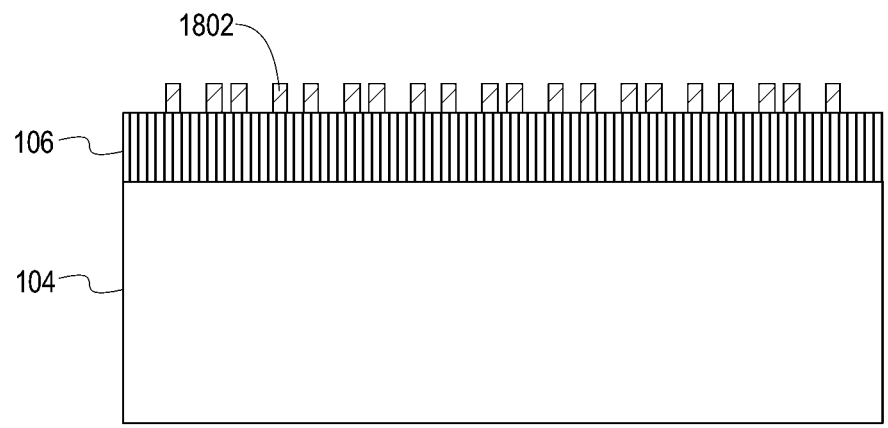
FIG. 18 illustrates the formation of a hard mask.

Turning to FIG. 18, a hard mask 1802 is formed. The hard mask 1802 is created by selectively removing one of the two spacer materials. If the spacer material to be stripped is intrinsic polycrystalline silicon, a potassium hydroxide/isopropyl alcohol (KOH/IPA) solution is used to remove the spacer material. If the spacer material to be removed is P-doped polycrystalline silicon, a KOH solution is used to remove the spacer material. Again, if alternate spacer materials are utilized alternate wet etches or dry etches must be employed to remove the spacer materials.

Figure 19:
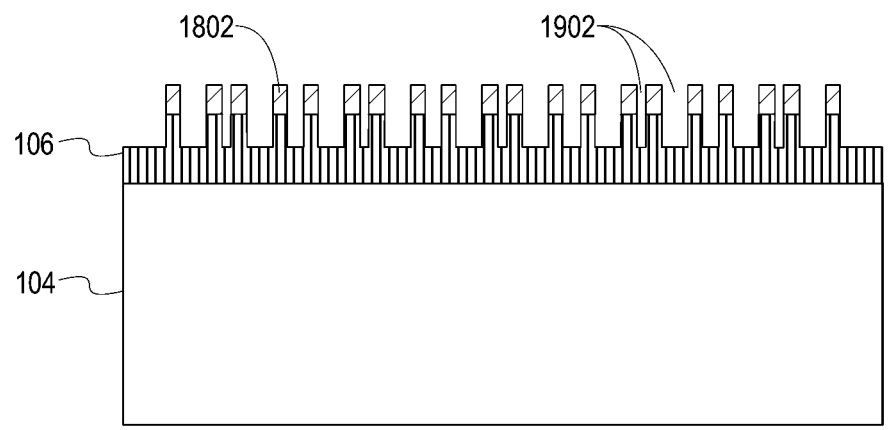
FIG. 19 illustrates the formation of trench structures in the substrate.

FIG. 19 shows a formation of the final trench structure 1902. This is accomplished by etching into the substrate with the hard mask 1802. In one embodiment of the invention where the insulating layer 106 is silicon dioxide, a sub-lithographic silicon dioxide RIE is utilized. In an alternate embodiment, where there is no insulating layer 106, a sub-lithographic silicon RIE is utilized. The sub-lithographic RIE used in etching into the substrate is dependent upon the substrate 104 and the insulating layer 106 deposited above the substrate 104 if an insulating layer 106 is employed.

Figure 20:
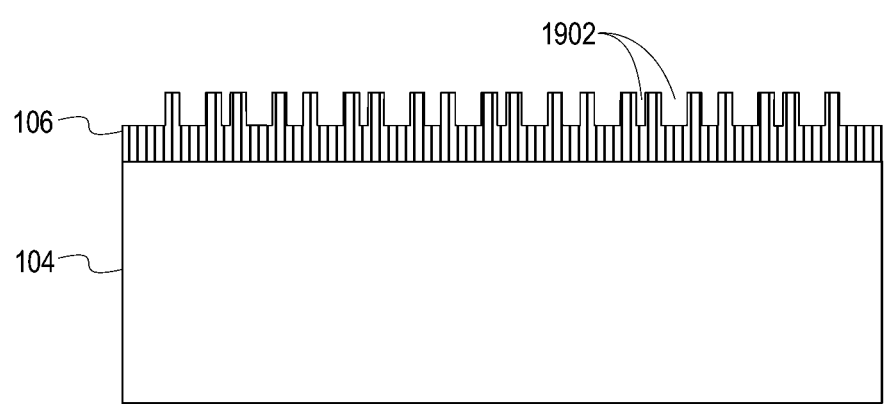
FIG. 20 illustrates the removal of the hard mask.

Turning to FIG. 20, the hard mask is selectively removed from the insulating layer 106, if an insulating layer 106 is used, and/or the silicon substrate 104. If the hard mask is comprised of P-doped polycrystalline silicon, a KOH solution is used to remove the hard mask. If the hard mask is comprised of intrinsic polycrystalline silicon, a KOH/IPA solution is used to remove the hard mask. The wet or dry etch used to remove the hard mask depends on the composition of the hard mask and the selectivity of the etchant towards the substrate 104 and insulating layer 106.

Having described preferred embodiments for sub-lithographic printing methods (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A trench structure disposed over a substrate, the trench structure formed at least in part by the steps of:
    depositing a sacrificial layer of a sacrificial material over the substrate;
    forming a first set of trenches in the sacrificial layer with a lithographic mask;
    filling the first set of trenches completely with a first set of step spacer blocks using two alternating spacer materials, the first set of step spacer blocks includes a first pair of step spacers along the inside walls of the first set of trenches using a first spacer material, a second pair of step spacers along the inside walls of the first pair of step spacers using a second spacer material, and a first spacer plug along the inside walls of the second pair of step spacers using the first spacer material, the two alternating spacer materials being separately removable;
    forming a second set of trenches by selectively removing the remaining sacrificial material after filling the first set of trenches;
    filling the second set of trenches completely with a second set of step spacer blocks using the two alternating spacer materials in continuing sequence with the first set of step spacer blocks in the first set of trenches;
    forming a hard mask by selectively removing one of the two alternating spacer materials; and
    using the hard mask to etch the trench structure in the substrate.

2. The trench structure of claim 1, wherein the second set of step spacer blocks includes a third pair of step spacers along the inside walls of the second set of trenches using the first spacer material, a fourth pair of step spacers along the inside walls of the second pair of step spacers using the second spacer material, and a second spacer plug along the inside walls of the second pair of step spacers using the first spacer material.

3. An integrated circuit comprising a trench structure disposed over a substrate, the trench structure formed at least in part by the steps of:
    depositing a sacrificial layer of a sacrificial material over the substrate;
    forming a first set of trenches in the sacrificial layer with a lithographic mask;
    filling the first set of trenches completely with a first set of step spacer blocks using two alternating spacer materials, the first set of step spacer blocks includes a first pair of step spacers along the inside walls of the first set of trenches using a first spacer material, a second pair of step spacers along the inside walls of the first pair of step spacers using a second spacer material, and a first spacer plug along the inside walls of the second pair of step spacers using the first spacer material, the two alternating spacer materials being separately removable;
    forming a second set of trenches by selectively removing the remaining sacrificial material after filling the first set of trenches;
    filling the second set of trenches completely with a second set of step spacer blocks using the two alternating spacer materials in continuing sequence with the first set of step spacer blocks in the first set of trenches;
    forming a hard mask by selectively removing one of the two alternating spacer materials; and
    using the hard mask to etch the trench structure in the substrate.

4. The integrated circuit of claim 3, wherein the second set of step spacer blocks includes a third pair of step spacers along the inside walls of the second set of trenches using the first spacer material, a fourth pair of step spacers along the inside walls of the second pair of step spacers using the second spacer material, and a second spacer plug along the inside walls of the second pair of step spacers using the first spacer material.

* * * * *